US009414491B2

United States Patent
Kitajo et al.

(10) Patent No.: US 9,414,491 B2
(45) Date of Patent: Aug. 9, 2016

(54) JUMPER MODULE MOUNTING CIRCUIT BOARD AND CIRCUIT BOARD ASSEMBLY

(71) Applicant: YAZAKI CORPORATION, Minato-ku, Tokyo (JP)

(72) Inventors: Takanori Kitajo, Shizuoka (JP); Masaki Sugiyama, Shizuoka (JP); Masayuki Naohara, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 14/469,675

(22) Filed: Aug. 27, 2014

(65) Prior Publication Data

US 2015/0062834 A1    Mar. 5, 2015

(30) Foreign Application Priority Data

Aug. 28, 2013   (JP) .................................. 2013-176530
Jan. 9, 2014     (JP) .................................. 2014-002152

(51) Int. Cl.
*H05K 7/00*   (2006.01)
*H05K 1/11*   (2006.01)
(Continued)

(52) U.S. Cl.
CPC .............. *H05K 1/111* (2013.01); *H01R 12/526* (2013.01); *H01R 29/00* (2013.01); *H05K 3/222* (2013.01); *H05K 1/029* (2013.01); *H05K 1/14* (2013.01); *H05K 1/182* (2013.01); *H05K 2201/042* (2013.01); *H05K 2201/09209* (2013.01); *H05K 2201/10363* (2013.01); *H05K 2201/10954* (2013.01)

(58) Field of Classification Search
USPC .................. 361/728, 729, 720, 721, 760, 748
See application file for complete search history.

(56) References Cited

U.S. PATENT DOCUMENTS 4,622,527 A * 11/1986 Carlson ................ H03H 1/0007
                                                   333/12
5,504,373 A *  4/1996 Oh ......................... G11C 29/88
                                                  257/690
(Continued)

FOREIGN PATENT DOCUMENTS

CN     1150347 A    5/1997
EP     2291062 A1   3/2011
(Continued)

OTHER PUBLICATIONS

Communication dated Mar. 11, 2016, from the State Intellectual Property Office of People's Republic of China in counterpart Application No. 201410429503.0.

*Primary Examiner* — Hung S Bui
(74) *Attorney, Agent, or Firm* — Sughrue Mion, PLLC

(57) ABSTRACT

A jumper module mounting circuit board includes: a circuit board; and a jumper module having an insulator main body provided with conductive electrical connection parts for connecting between connection patterns so as to provide electrical continuity therebetween by connecting each of contact parts on both ends of the conductive electrical connection parts to the connection patterns which are formed to be spaced apart from each other on the circuit board. The jumper module is mounted onto the circuit board so as to connect between the contact parts and the connection patterns that are formed to be spaced apart from each other. The circuit board includes a connection pattern concentrated section that is formed by concentrating the connection patterns depending on a plurality of wiring specifications at a mount position of the jumper module.

9 Claims, 18 Drawing Sheets

(51) Int. Cl.
*H01R 12/52* (2011.01)
*H01R 29/00* (2006.01)
*H05K 3/22* (2006.01)
*H05K 1/14* (2006.01)
*H05K 1/02* (2006.01)
*H05K 1/18* (2006.01)

(56) References Cited

U.S. PATENT DOCUMENTS 5,772,452 A * 6/1998 Aoyama ................ H01R 12/73
439/74
5,949,657 A * 9/1999 Karabatsos ............ H05K 1/117
174/254
6,614,664 B2 * 9/2003 Lee ........................ H05K 1/144
361/748
7,601,025 B1 * 10/2009 Phillips ................ H01R 12/523
439/541.5
2011/0083889 A1 * 4/2011 Niitsu .................... H05K 1/119
174/258

FOREIGN PATENT DOCUMENTS

JP 2012-69313 A 4/2012
JP 2012-134399 * 7/2012 ............... H05K 1/11

* cited by examiner

JUMPER MODULE MOUNTING CIRCUIT BOARD AND CIRCUIT BOARD ASSEMBLY

CROSS-REFERENCE TO RELATED APPLICATIONS

The present application claims priority to and incorporates by reference the entire contents of Japanese Patent Application No. 2013-176530 filed in Japan on Aug. 28, 2013 and Japanese Patent Application No. 2014-002152 filed in Japan on Jan. 9, 2014.

BACKGROUND OF THE INVENTION

1. Field of the Invention

The present invention relates to a jumper module mounting circuit board with a jumper module mounted on a circuit board and to a circuit board assembly.

2. Description of the Related Art

Conventionally, jumper module mounting circuit boards are employed in order to connect between connection patterns, such as through holes formed to be spaced apart from each other on a circuit board, so as to provide electrical continuity therebetween.

The jumper module mounting circuit board includes a circuit board and a jumper module having an insulator main body provided with conductive electrical connection parts. The electrical connection parts connect between connection patterns so as to provide electrical continuity therebetween by connecting each of contact parts on both ends of the conductive electrical connection parts to the connection patterns, which are formed to be spaced apart from each other on the circuit board. The jumper module is mounted onto the circuit board so as to connect between the contact parts and the connection patterns that are formed to be spaced apart from each other.

For example, disclosed in Japanese Patent Application Laid-open No. 2012-69313 is a jumper module mounting circuit board with a jumper module mounted on the circuit board. The jumper module is configured such that a plurality of gate-shaped jumper lines (electrical connection parts) are secured to an insulator resin member.

However, even when part of the jumper module mounting circuit board disclosed in Japanese Patent Application Laid-open No. 2012-69313 is changed in the wiring specifications, one had to employ a different circuit board depending on the required wiring specification. This caused an increase in costs of parts.

SUMMARY OF THE INVENTION

The present invention has been developed in view of the aforementioned problem. It is an object of the present invention to provide a jumper module mounting circuit board and a circuit board assembly which enable costs of parts to be reduced.

It is an object of the present invention to at least partially solve the problems in the conventional technology.

According to one aspect of the present invention, a jumper module mounting circuit board includes a circuit board; and a jumper module having an insulator main body provided with conductive electrical connection parts for connecting between connection patterns so as to provide electrical continuity therebetween by connecting each of contact parts on both ends of the conductive electrical connection parts to the connection patterns which are formed to be spaced apart from each other on the circuit board, the jumper module being mounted onto the circuit board so as to connect between the contact parts and the connection patterns that are formed to be spaced apart from each other, wherein the circuit board has a connection pattern concentrated section that is formed by concentrating the connection patterns depending on a plurality of wiring specifications at a mount position of the jumper module, and the jumper module is configured such that the contact parts selectively connect to the connection patterns of the connection pattern concentrated section depending on the plurality of wiring specifications.

According to another aspect of the present invention, the connection pattern concentrated section includes a first connection pattern array which is formed by aligning at equal intervals the plurality of connection patterns connecting to the contact parts on one end side of the electrical connection parts, and a second connection pattern array which is formed by aligning the plurality of connection patterns connecting to the contact parts on the other end so as to be disposed side by side with the first connection pattern array, and the jumper module is configured such that the insulator main body has the same shape irrespective of wiring specifications, and the contact parts on the one end side are aligned depending on a layout of the first connection pattern array, and the contact parts on the other end side are aligned depending on a layout of the second connection pattern array.

According to still another aspect of the present invention, the insulator main body has a mounting orientation mark projection that serves as a mark for indicating a normal mounting orientation in which the jumper module is to be mounted onto the circuit board.

According to still another aspect of the present invention, the jumper module mounting circuit board according to any one of the aspects; and a second circuit board different from the circuit board, wherein the jumper module has at least one of the electrical connection parts which connects the contact part on one end side to the connection pattern and which connects the contact part on the other end side to a second connection pattern formed on the second circuit board.

According to still another aspect of the present invention, the second circuit board has a second connection pattern concentrated section that is formed by concentrating the second connection patterns depending on a plurality of wiring specifications, and the jumper module is configured such that the contact parts selectively connect to both the connection patterns of the connection pattern concentrated section and to the second connection patterns of the second connection pattern concentrated section.

According to still another aspect of the present invention, the second circuit board mounts a second jumper module that connects to at least one of the second connection patterns.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1A:
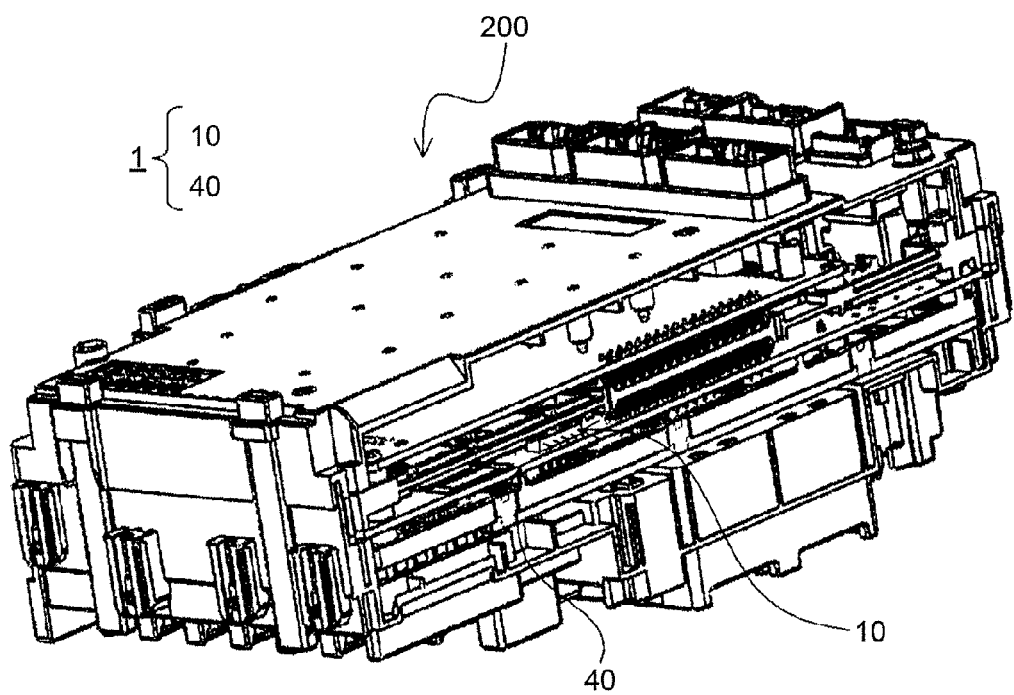
FIG. 1A is a perspective view of an electrical junction box into which a jumper module mounting circuit board according to a first embodiment of the present invention is incorporated.

Now, referring to the drawings, a jumper module mounting circuit board and a circuit board assembly according to the present invention will be described in more detail in accordance with preferred embodiments.

First Embodiment

Figure 1B:
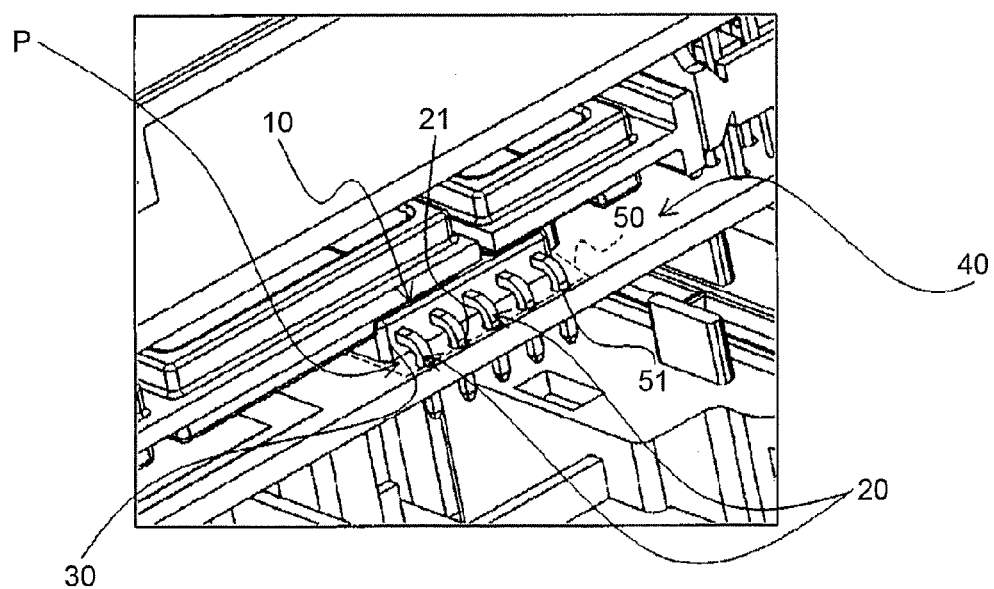
FIG. 1B is an enlarged view illustrating the vicinity of the jumper module of FIG. 1A.
Figure 2:
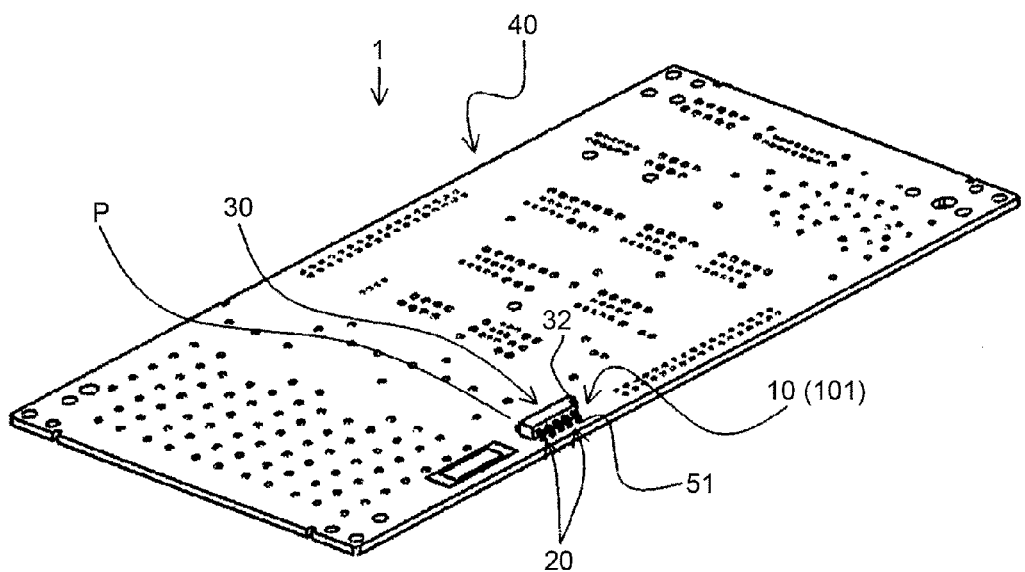
FIG. 2 is a perspective view of the jumper module mounting circuit board.
Figure 3:
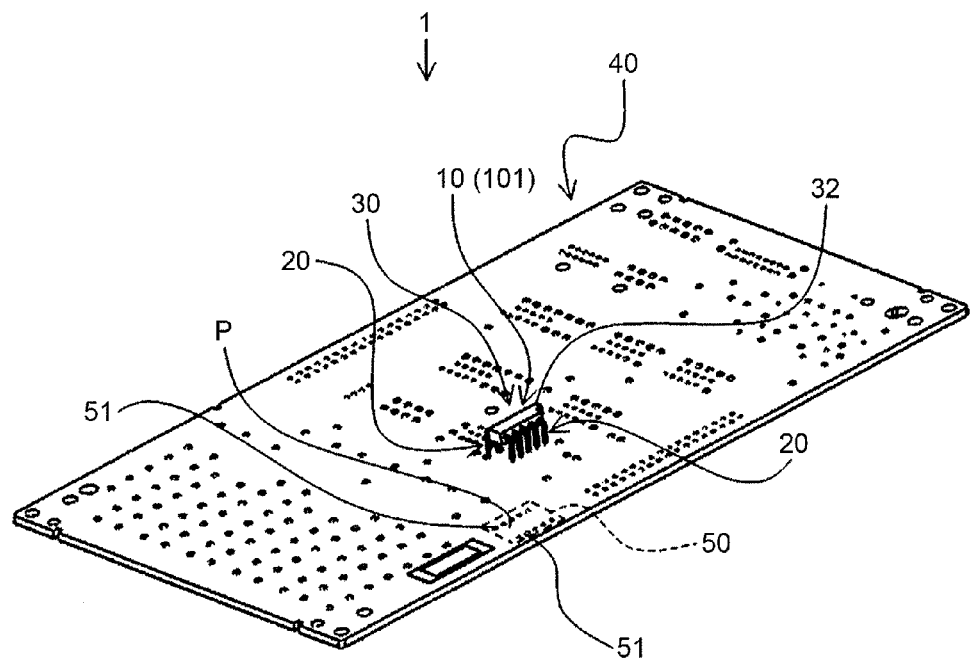
FIG. 3 is a perspective view of a jumper module mounting circuit board before a jumper module is attached to a circuit board.
Figure 4A:
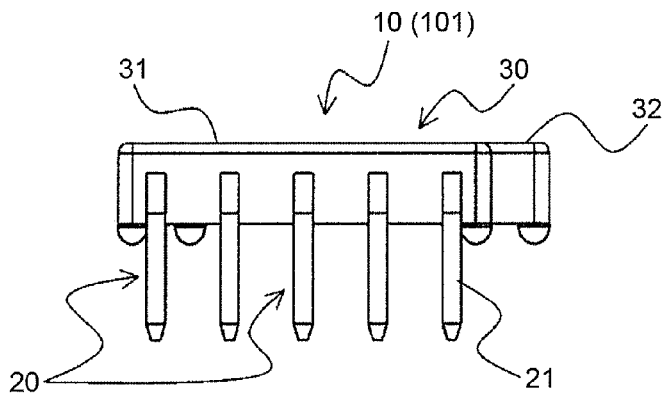
FIG. 4A is a side view of a jumper module.
Figure 4B:
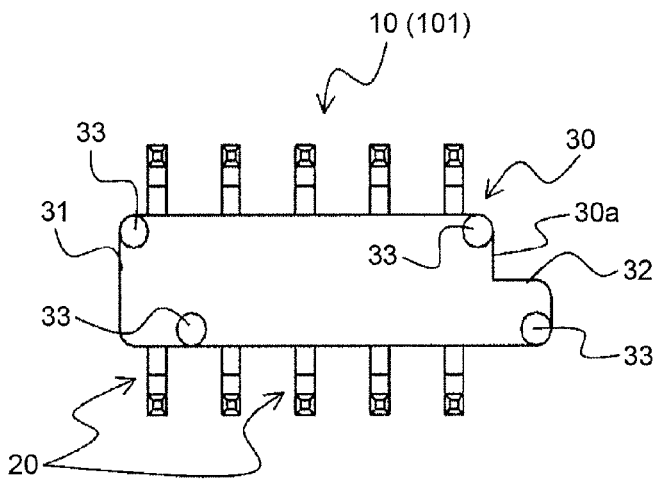
FIG. 4B is a bottom view of the jumper module.
Figure 4C:
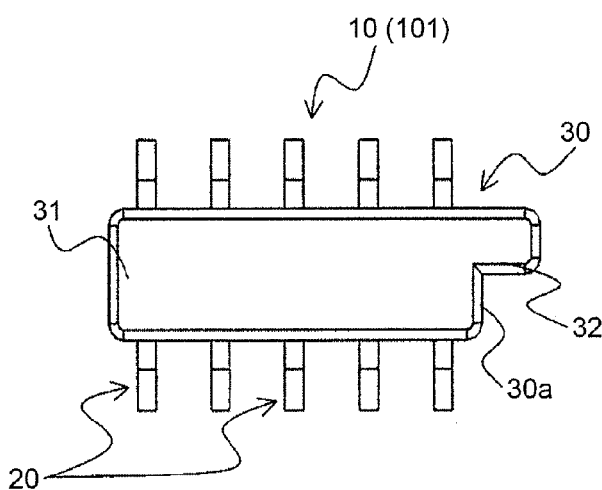
FIG. 4C is a top view of the jumper module.
Figure 4D:
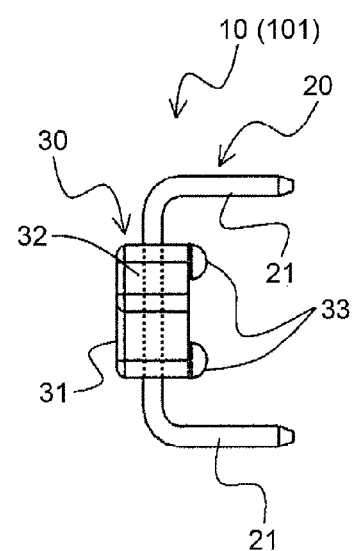
FIG. 4D is a front view of the jumper module.
Figure 5A:
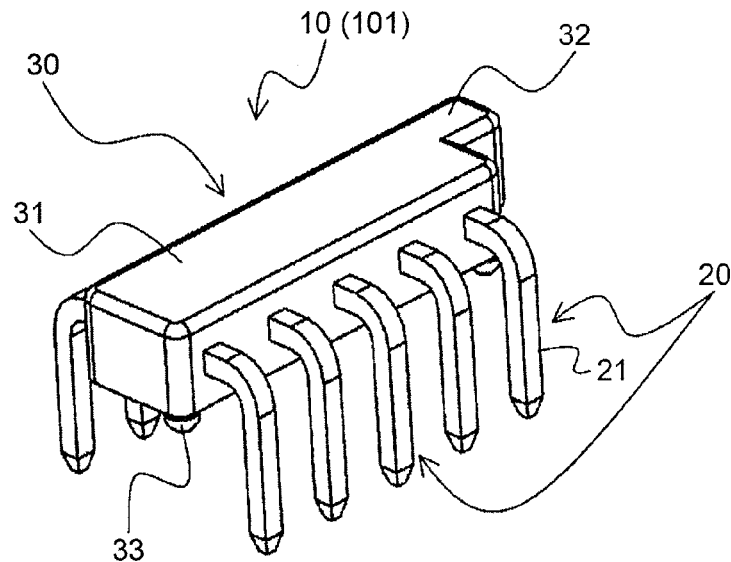
FIGS. 5A and 5B are perspective views of the jumper module when viewed in directions different from each other.
Figure 5B:
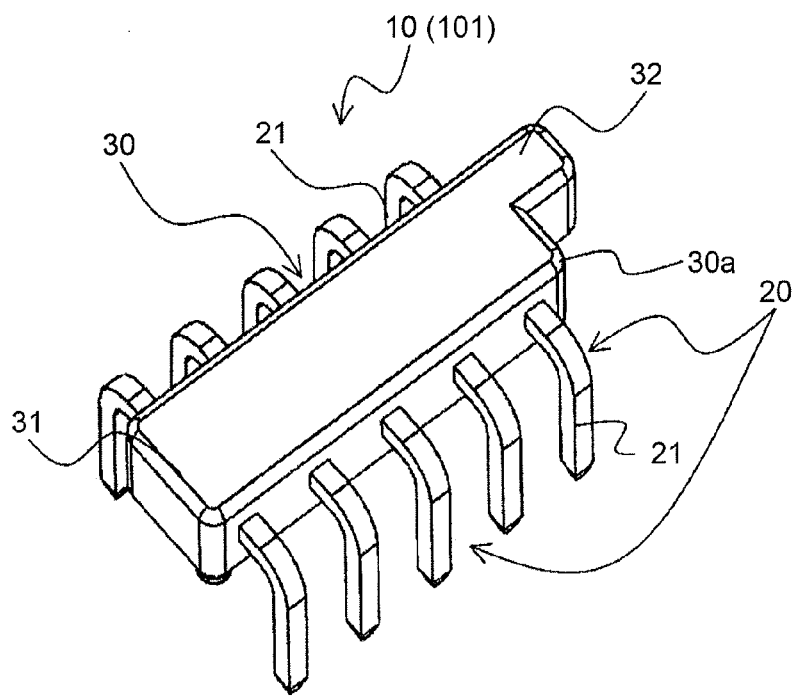
Figure 7A:
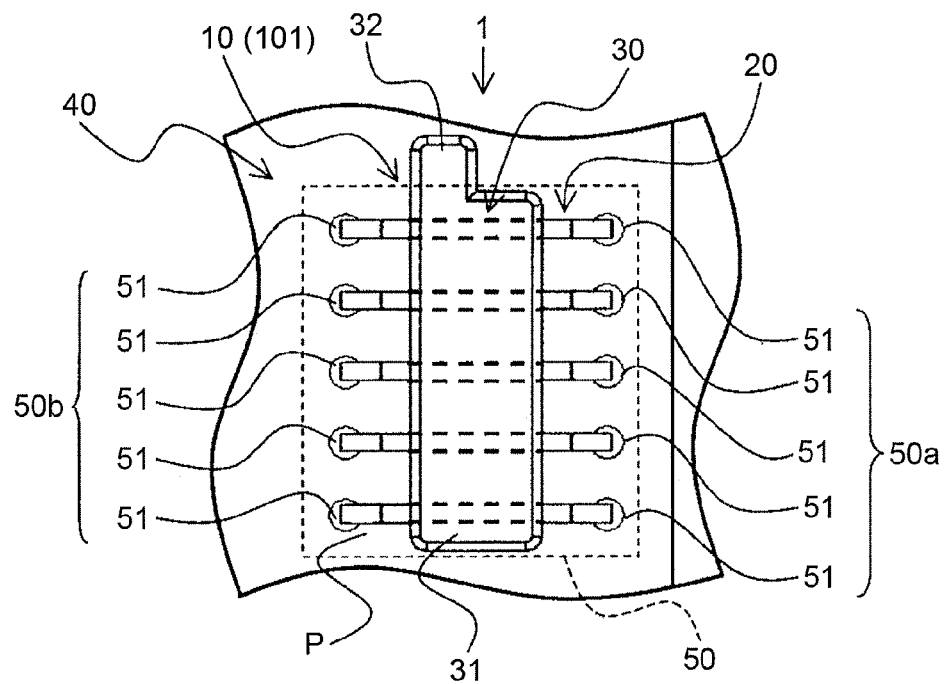
FIG. 7A is an enlarged view illustrating the vicinity of the jumper module of the jumper module mounting circuit board illustrated in FIG. 2.
Figure 7B:
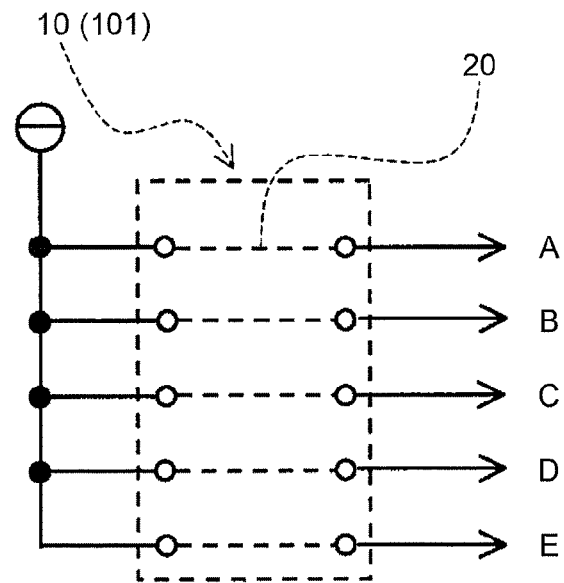
FIG. 7B is a schematic circuit diagram illustrating the circuit configuration in the vicinity of the jumper module of the jumper module mounting circuit board.
Figure 8A:
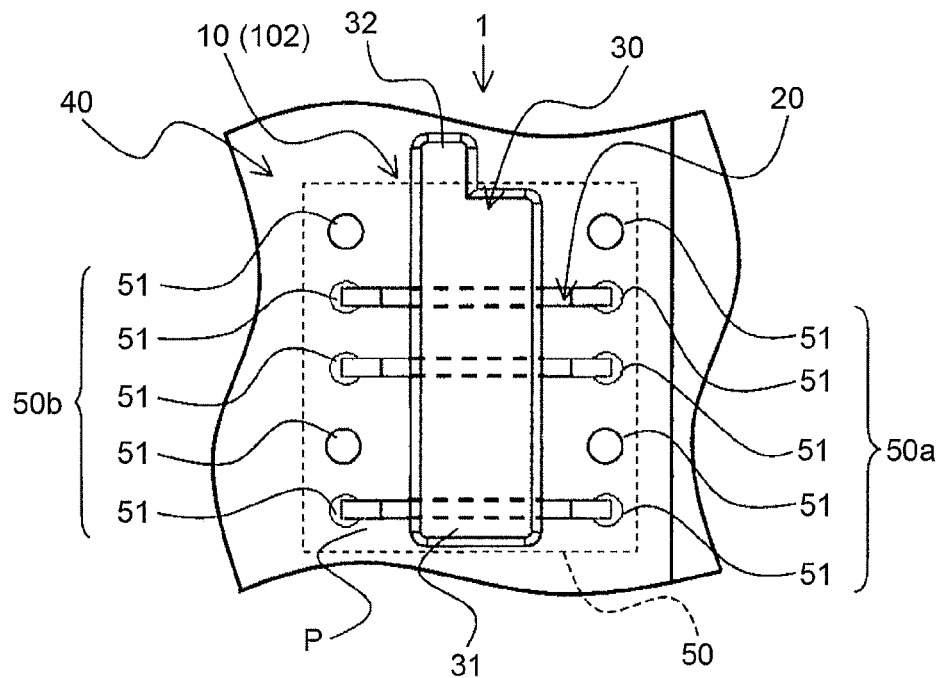
FIG. 8A is an enlarged view illustrating the vicinity of the jumper module of the jumper module mounting circuit board which is different from that of FIG. 2 in the wiring specification.
Figure 8B:
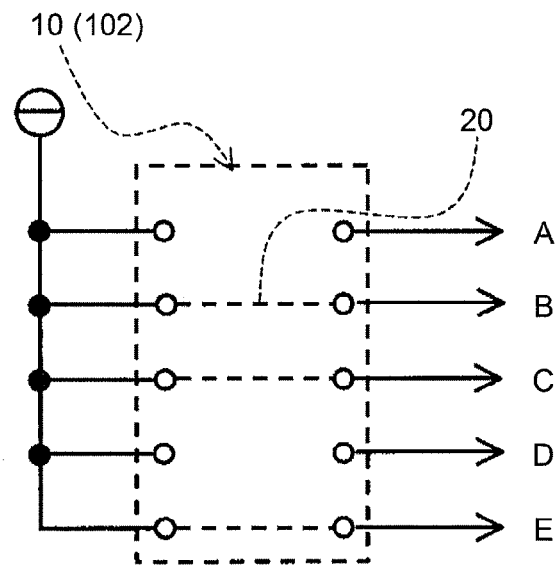
FIG. 8B is a schematic circuit diagram illustrating the circuit configuration in the vicinity of the jumper module of the jumper module mounting circuit board.
Figure 9A:
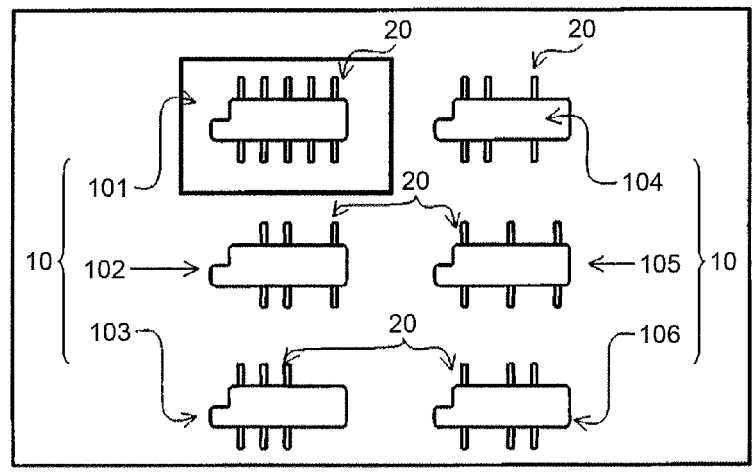
FIGS. 9A to 9C are explanatory views illustrating how to choose a jumper module of one wiring specification from among a plurality of jumper modules depending on the respective wiring specifications and then mount the resulting one onto the circuit board.
Figure 9B:
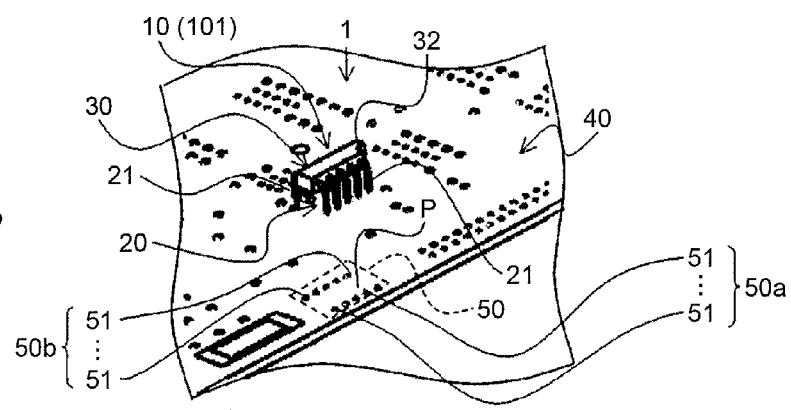
Figure 9C:
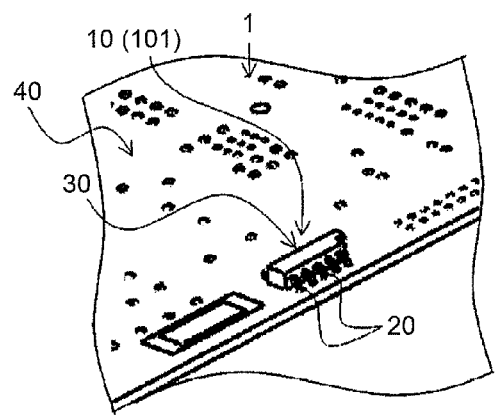

FIG. 1A is a perspective view of an electrical junction box 200 into which a jumper module mounting circuit board 1 according to a first embodiment of the present invention is incorporated, and FIG. 1B is an enlarged view illustrating the vicinity of a jumper module 10 of FIG. 1A. FIG. 2 is a perspective view of the jumper module mounting circuit board 1. FIG. 3 is a perspective view of the jumper module mounting circuit board 1 before the jumper module 10 is attached to a circuit board 40. FIG. 4A is a side view of the jumper module 10, FIG. 4B is a bottom view of the jumper module 10, FIG. 4C is a top view of the jumper module 10, and FIG. 4D is a front view of the jumper module 10. FIGS. 5A and 5B are perspective views of the jumper module 10 when viewed in directions different from each other. FIGS. 6A to 6F illustrate, by way of example, a plurality of jumper modules 10 depending on the respective wiring specifications. FIG. 7A is an enlarged view illustrating the vicinity of a jumper module 101 of the jumper module mounting circuit board 1 illustrated in FIG. 2, and FIG. 7B is a schematic circuit diagram illustrating the circuit configuration in the vicinity of the jumper module of the jumper module mounting circuit board 1. FIG. 8A is an enlarged view illustrating the vicinity of a jumper module 102 of the jumper module mounting circuit board 1 which is different from that of FIG. 2 in the wiring specification, and FIG. 8B is a schematic circuit diagram illustrating the circuit configuration in the vicinity of the jumper module 102 of the jumper module mounting circuit board 1. FIGS. 9A to 9C are explanatory views illustrating how to choose a jumper module 10 of one wiring specification from among a plurality of jumper modules 10 depending on the respective wiring specifications and then mount the resulting one onto the circuit board 40.

Note that FIGS. 2, 3, and 9A to 9C do not illustrate the parts to be mounted onto the circuit board 40 other than the jumper module 10.

As illustrated in FIGS. 1A and 1B, the jumper module mounting circuit board 1 according to the first embodiment of the present invention is incorporated, for example, into the electrical junction box 200 which distributes power or signals to a plurality of electrical components to be mounted onto an automobile.

The jumper module mounting circuit board 1 has the circuit board 40 and the jumper module 10 having an insulator main body 30 which is provided with conductive electrical connection parts 20. The electrical connection parts 20 connect between connection patterns 51 so as to provide electrical continuity therebetween by connecting each of contact parts 21 on both ends of the electrical connection parts 20 to the connection patterns 51 that are formed to be spaced apart from each other on the circuit board 40. The jumper module 10 is mounted onto the circuit board 40 so as to connect between the contact parts 21 and the connection patterns 51 that are formed to be spaced apart from each other.

First, a description will be made to the jumper module 10.

The jumper module 10 is configured such that the contact parts 21 selectively connect to the connection patterns 51 of a connection pattern concentrated section 50, to be discussed later, on the circuit board 40 depending on the wiring specification. That is, the jumper module 10 is configured such that the insulator main body 30 is provided with the electrical connection parts 20 depending on the wiring specification.

Note that a description will be made to a typical jumper module 10 (hereafter to be denoted by symbol 101) which has five electrical connection parts 20.

As illustrated in FIGS. 4A to 5B, the electrical connection part 20 is formed by bending a bar-shaped metal member into a gate shape, with both end portions serving as the contact parts 21, 21. Each of the electrical connection parts 20 is molded integrally with the insulator main body 30. That is, the insulator main body 30 securely holds each of the electrical connection parts 20.

The insulator main body 30, which is made of an insulation material such as a synthetic resin, has: a rectangular parallelepiped base part 31; a mounting orientation mark projection 32 which is a projection for indicating the normal mounting orientation in which the jumper module 101 should be mounted to the circuit board 40; and a plurality of spacer projections 33 that serve to ensure a predetermined clearance between the insulator main body 30 and the circuit board 40.

The mounting orientation mark projection 32 is provided in a protruding manner on one side 30a from which no electrical connection parts 20 are protruded. A worker can check the normal mounting orientation of the jumper module 101 with respect to the side 30a on which the mounting orientation mark projection 32 is provided.

The spacer projections 33 are protruded in a hemispherical shape from the lower surface of the insulator main body 30 and provided at four positions. More specifically, the spacer projections 33 are located in the vicinity of the respective four corners of the insulator main body 30 and disposed so as to be displaced from each other in the longitudinal direction of the insulator main body 30. Such spacer projections 33 allow the jumper module 101 to be mounted on the circuit board 40 in a normal attitude because one of the spacer projections 33 is provided on the mounting orientation mark projection 32.

Furthermore, the spacer projections 33 are provided with a hemispherical lower surface and thereby allowed to be in point contact with the circuit board 40. This allows the spacer projections 33 to be in contact with the circuit board 40 on reduced areas, thereby providing a high degree of flexibility in the pattern layout on the circuit board 40.

Still furthermore, since the spacer projections 33 are displaced from each other in the longitudinal direction of the insulator main body 30, each of the spacer projections 33 can be easily formed in metal molds when the upper and lower metal molds (not shown) are moved in the short direction of the insulator main body 30 and then combined at the center in the short direction so as to form the insulator main body 30 in the metal molds.

Note that as the jumper module 10 to be selectively connected to the connection patterns 51 of the connection pattern concentrated section 50, a plurality of jumper modules 101, 102, 103, 104, 105, and 106 can be illustrated, by way of example, as illustrated in FIGS. 6A to 6F. FIGS. 6B to 6F denote other jumper modules than the jumper module 101 of FIG. 6A by reference numerals 102, 103, 104, 105, and 106. FIGS. 6A to 6F also denote unnecessary electrical connection parts 20 by broken lines to clearly indicate the positional relationship with the electrical connection parts 20 of other specifications, and as well shows corresponding load symbols A, B, C, D, and E near the electrical connection parts 20 which are connected to the conductors extending to the respective loads A, B, C, D, and E, respectively, to be discussed later.

Note that the jumper module 10 is not limited to the types illustrated, by way of example, in FIGS. 6A to 6F.

The jumper modules 101, 102, 103, 104, 105, and 106 employ the insulator main body 30 having the same shape irrespective of the wiring specification. The contact parts 21 on one end side are aligned depending on the layout of a first connection pattern array 50a to be discussed later, and the contact parts 21 on the other end side are aligned depending on the layout of a second connection pattern array 50b.

Now, a description will be made to the circuit board 40.

The circuit board 40 has the connection pattern concentrated section 50 in which the connection patterns 51 depending on a plurality of wiring specifications are formed by being concentrated at a position P where the jumper module 10 is mounted.

Thus, when any one jumper module 10 out of the plurality of the jumper modules 101, 102, 103, 104, 105, and 106 is mounted on the circuit board 40, the contact parts 21 of the jumper module 10 are connected to the corresponding connection patterns 51 of the connection pattern concentrated section 50.

As illustrated in FIGS. 7A and 7B, the connection pattern concentrated section 50 has: the first connection pattern array 50a that is formed by aligning at equal intervals five connection patterns 51 to be connected to the contact parts 21 on one end side of the electrical connection parts 20; and the second connection pattern array 50b that is formed by aligning five connection patterns 51 to be connected to the contact parts 21 on the other end side so as to be disposed in concurrence with the first connection pattern array 50a.

Each of the connection patterns 51 is a through hole that is formed in the circuit board 40, so that each of the connection patterns 51 of the first connection pattern array 50a is connected, for example, to a wiring extending to a power supply. On the other hand, the connection patterns 51 of the second connection pattern array 50b are each connected to a wiring extending to each of loads A, B, C, D, and E.

As illustrated in FIGS. 7A and 7B, when the jumper module 101 is mounted on such a circuit board 40, each of the contact parts 21 of the five electrical connection parts 20 is connected to a corresponding connection pattern 51 of the connection pattern concentrated section 50, thereby connecting between the loads A, B, C, D, and E and the conductor extending to the power supply so as to provide electrical continuity therebetween.

Figure 6A:
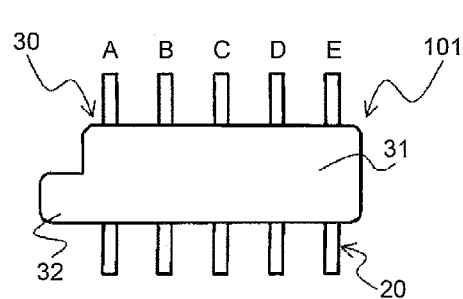
FIGS. 6A to 6F illustrate, by way of example, a plurality of jumper modules depending on the respective wiring specifications.
Figure 6D:
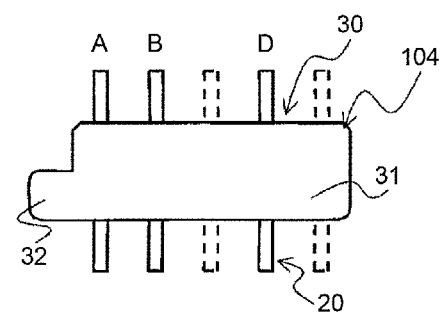
Figure 6B:
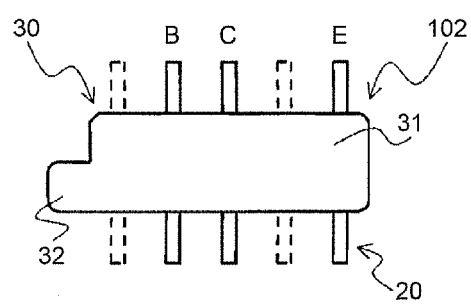
Figure 6E:
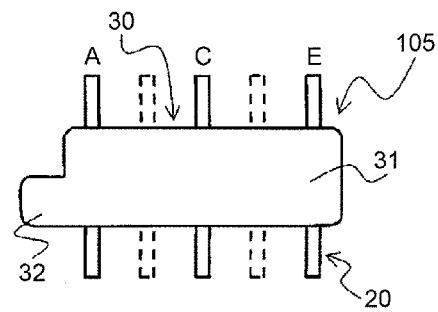
Figure 6C:
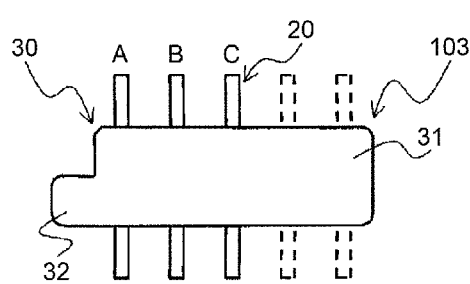
Figure 6F:
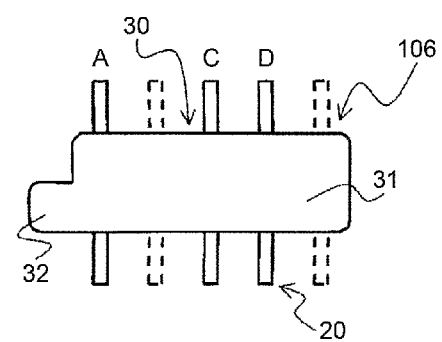

On the other hand, when the jumper module 102 illustrated in FIG. 6B is mounted onto the circuit board 40, each of the contact parts 21 of the three electrical connection parts 20 is connected to a corresponding connection pattern 51 of the connection pattern concentrated section 50 as illustrated in FIGS. 8A and 8B, thereby connecting between the loads B, C, and E and the wiring extending to the power supply so as to provide electrical continuity therebetween.

That is, the jumper module 10 to be mounted onto the common circuit board 40 can be modified depending on the wiring specification, thereby fabricating the jumper module mounting circuit board 1 depending on the wiring specification.

Now, referring to FIGS. 9A to 9C, a description will be made to the procedure for mounting the jumper module 10 onto the circuit board 40.

FIGS. 9A to 9C are explanatory views illustrating the procedure for mounting the jumper module 10 onto the circuit board 40.

Note that the procedure to be described will be performed by the worker, but may also be carried out by an automatic machine.

Furthermore, in this work, the jumper module 10 depending on the wiring specification is manufactured in advance. Note that in this work, the jumper module 101 is manufactured from among the aforementioned jumper modules 101, 102, 103, 104, 105, and 106 (refer to FIG. 9A).

Note that to fix the jumper module 10 depending on a wiring specification to the aforementioned six types of jumper modules 101, 102, 103, 104, 105, and 106, the six types of jumper modules 101, 102, 103, 104, 105, and 106 may also be manufactured in advance.

First, with the mounting orientation mark projection 32 serving as a mark, the worker aligns the orientation of the jumper module 101 with the normal mounting orientation on the circuit board 40 (refer to FIG. 9B).

Subsequently, the worker mounts the jumper module 101 at the mount position on the circuit board 40, thus completing the work. In this work, each of the contact parts 21 is inserted into the through hole of each of the connection patterns 51 until the tip of each spacer projection 33 of the jumper module 101 impinges the circuit board 40.

This allows each of the contact parts 21 of the jumper module 101 to be selectively connected to the connection pattern 51 of the connection pattern concentrated section 50 depending on the wiring specification.

Note that the jumper module 101 can be positioned at the mount position in the same manner as for the other jumper modules 102, 103, 104, 105, and 106 because the insulator main body 30 has the same shape irrespective of the wiring specification and the contact parts 21 are arranged depending on the first connection pattern array 50a and the second connection pattern array 50b.

Note that after this work, each of the contact parts 21 and each of the connection patterns 51, which have been connected to each other, are soldered.

Furthermore, even in the case of the jumper module mounting circuit board 1 having a different wiring specification, the same procedure as the aforementioned one is performed because any one of the different jumper modules 102, 103, 104, 105, and 106 has only to be mounted on the common circuit board 40.

The jumper module mounting circuit board 1 according to the first embodiment of the present invention can accommodate a plurality of wiring specifications by replacing the jumper module 10 to be mounted on the circuit board 40. It is thus possible to reduce costs of parts by employing the circuit board 40 as a common part.

Furthermore, the jumper module mounting circuit board 1 according to the first embodiment of the present invention is configured such that the jumper module 10 employs the insulator main body 30 having the same shape irrespective of the wiring specification, while the contact parts 21 are aligned depending on the layouts of the first connection pattern array 50a and the second connection pattern array 50b. It is thus possible to position the jumper module 10 at a mount position in the same procedure irrespective of the wiring specification, and as a result, it is possible to facilitate the positioning of the contact parts 21 and the connection patterns 51 that are connected to each other.

Furthermore, the jumper module mounting circuit board 1 according to the first embodiment of the present invention enables it to check the mounting orientation of the jumper module 10 with the mounting orientation mark projection 32 serving as a mark, thereby preventing the jumper module 10 from being mistakenly oriented and mounted onto the circuit board 40.

First Modified Example

Figure 10:
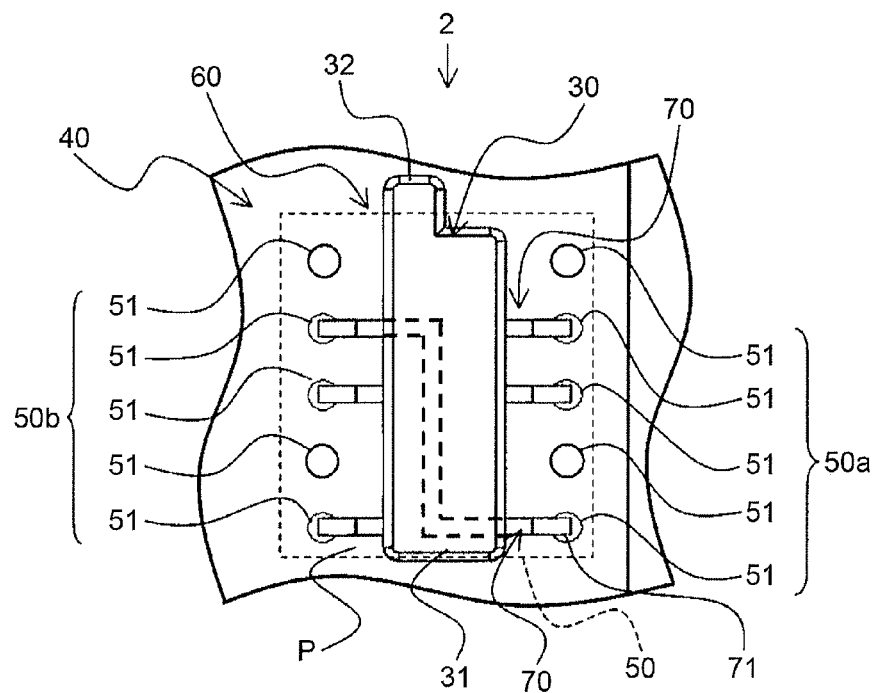
FIG. 10 is an enlarged view illustrating the vicinity of the jumper module of a jumper module mounting circuit board according to a first modified example.

Now, referring to FIG. 10, a description will be made to the first modified example of the jumper module mounting circuit board 1 according to the first embodiment of the present invention. FIG. 10 is an enlarged view illustrating the vicinity of a jumper module 60 of a jumper module mounting circuit board 2 according to the first modified example.

Note that FIG. 10 illustrates, by broken lines, only one electrical connection part 70 that is hidden inside the insulator main body 30.

The jumper module mounting circuit board 2 according to the first modified example is different from the jumper module mounting circuit board 1 of the first embodiment in that the electrical connection parts 70 employ no gate-like shape.

Note that the other components are the same as those of the first embodiment, and the same components as those of the first embodiment are denoted by the same reference symbols.

The electrical connection parts 70 are configured such that two connection patterns 51 of the first connection pattern array 50a and the second connection pattern array 50b are electrically connected to each other, where the two connection patterns 51 are not adjacent connection patterns 51 across the jumper module 60. Thus, the electrical connection parts 70 are bent in a complicated manner when compared with the first embodiment.

The jumper module mounting circuit board 2 according to the first modified example produces the same effects as those of the jumper module mounting circuit board 1 of the first embodiment.

Second Modified Example

Figure 11:
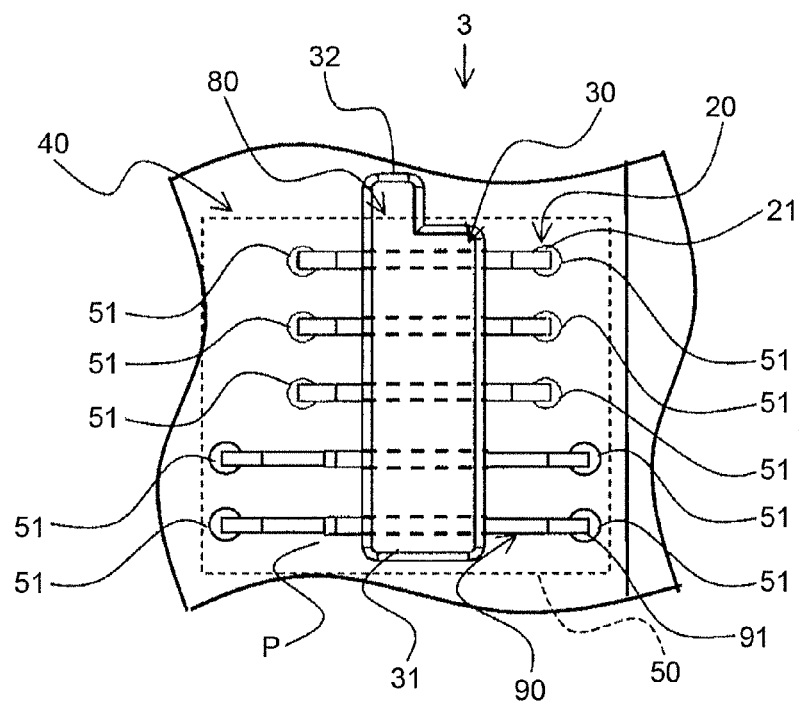
FIG. 11 is an enlarged view illustrating the vicinity of the jumper module of a jumper module mounting circuit board according to a second modified example.

Now, referring to FIG. 11, a description will be made to a second modified example of the jumper module mounting circuit board 1 according to the first embodiment of the present invention. FIG. 11 is an enlarged view illustrating the vicinity of a jumper module 80 of a jumper module mounting circuit board 3 according to the second modified example.

The jumper module mounting circuit board 3 according to the second modified example is different from the jumper module mounting circuit board 1 of the first embodiment in that the connection patterns 51 are not aligned and the contact parts 21 and 91 are also not aligned.

Note that the other components are the same as those of the first embodiment, and the same components as those of the first embodiment are denoted by the same reference symbols.

The jumper module mounting circuit board 3 according to the second modified example has the connection pattern concentrated section 50 that is formed by concentrating part of the connection patterns 51 at the mount position of the jumper module 80.

Like the jumper module mounting circuit board 1 of the first embodiment, the jumper module mounting circuit board 3 of the second modified example can accommodate a plurality of wiring specifications by replacing the jumper module 80 to be mounted onto the circuit board 40, thereby reducing costs of parts by using the circuit board 40 as a common part.

Furthermore, like the jumper module mounting circuit board 1 of the first embodiment, the jumper module mounting circuit board 3 according to the second modified example enables it to check the mounting orientation of the jumper module 80 with the mounting orientation mark projection 32 serving as a mark, thereby preventing the jumper module 80 from being mistakenly oriented and mounted onto the circuit board 40.

Second Embodiment

Now, referring to FIGS. 12A to 16B, a description will be made to the second embodiment of the present invention. In accordance with the second embodiment, a description will be made to a circuit board assembly 500 that includes a jumper module mounting circuit board 4.

Figure 12A:
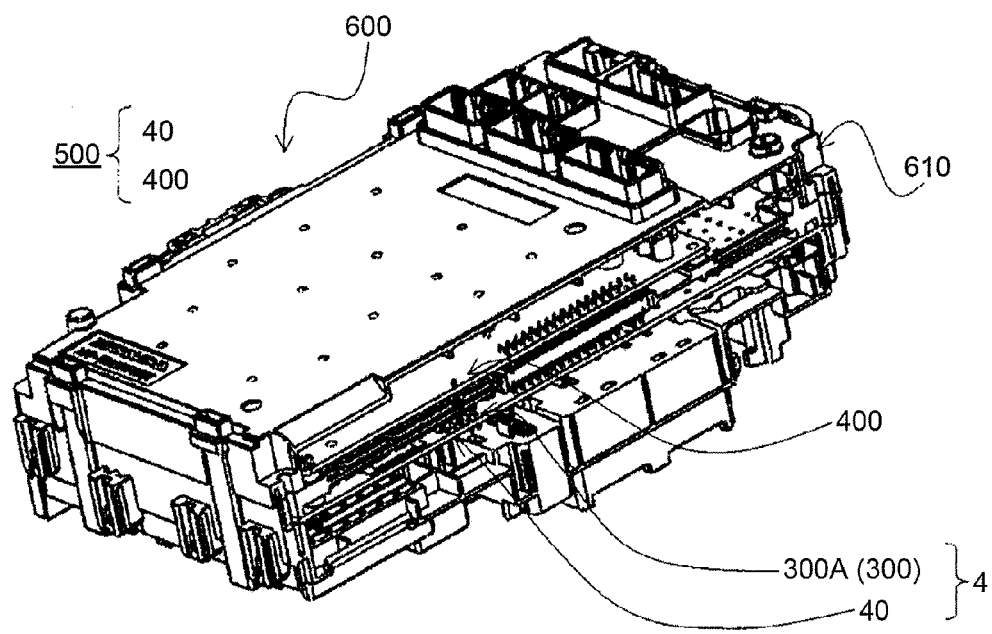
FIG. 12A is a perspective view of an electrical junction box into which a jumper module mounting circuit board according to a second embodiment of the present invention is incorporated.
Figure 12B:
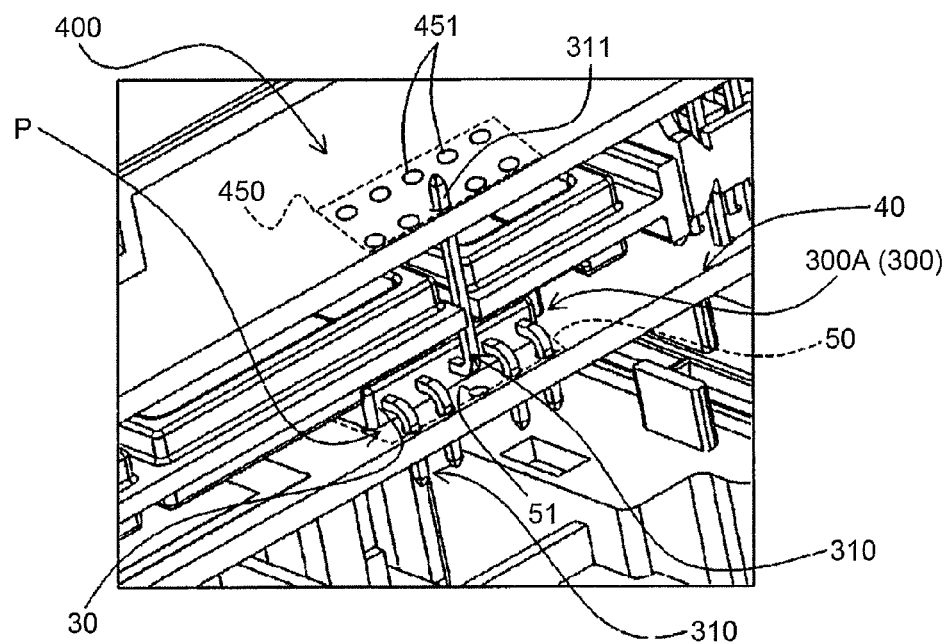
FIG. 12B is an enlarged view illustrating the vicinity of the jumper module of FIG. 12A.
Figure 13A:
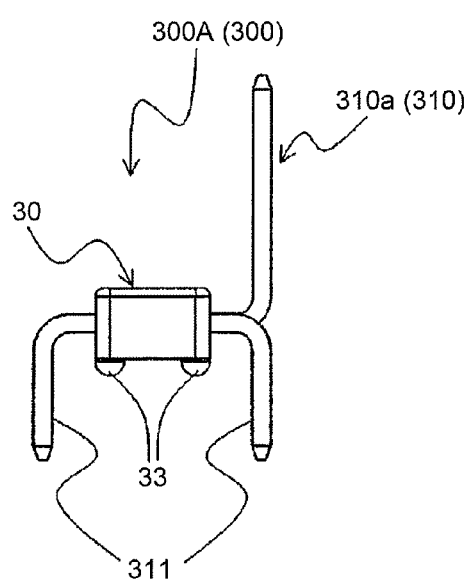
FIG. 13A is a rear view of the jumper module.
Figure 13B:
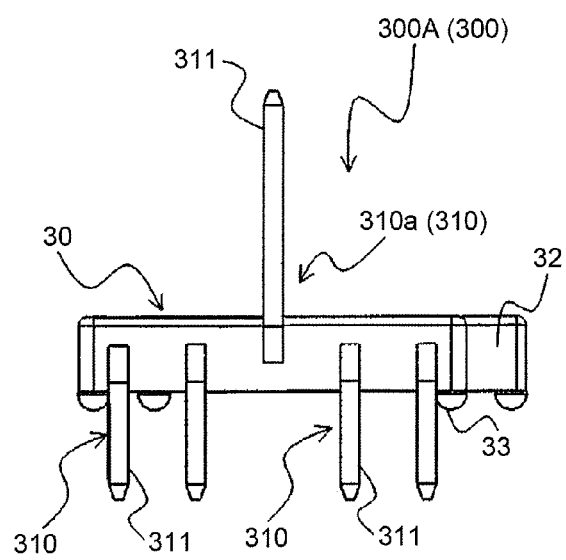
FIG. 13B is a side view of the jumper module.
Figure 13C:
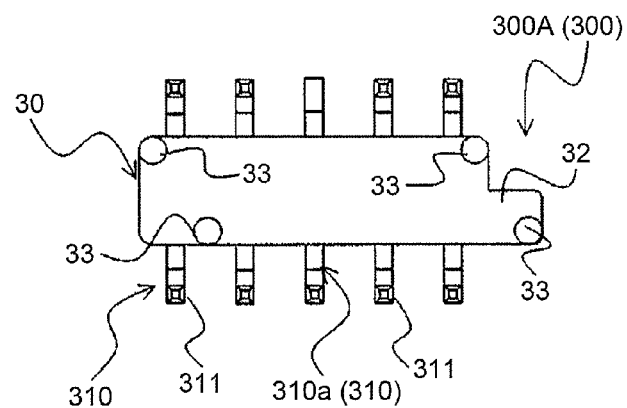
FIG. 13C is a bottom view of the jumper module.
Figure 14:
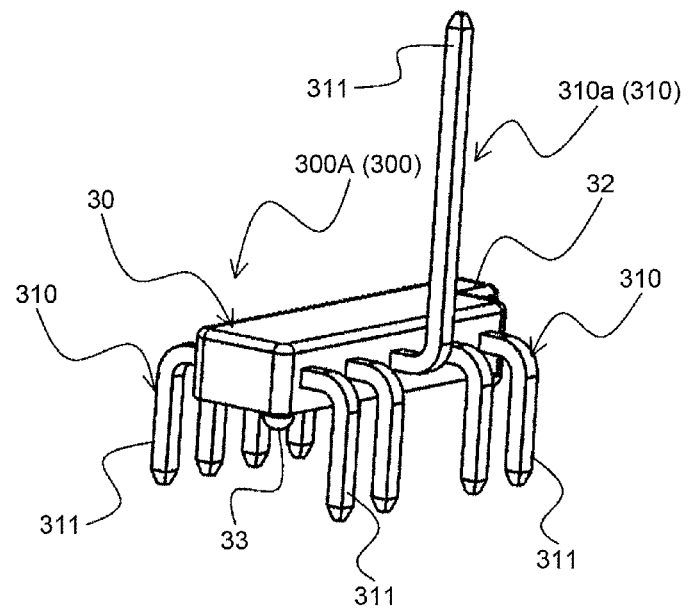
FIG. 14 is a perspective view of the jumper module.
Figure 15:
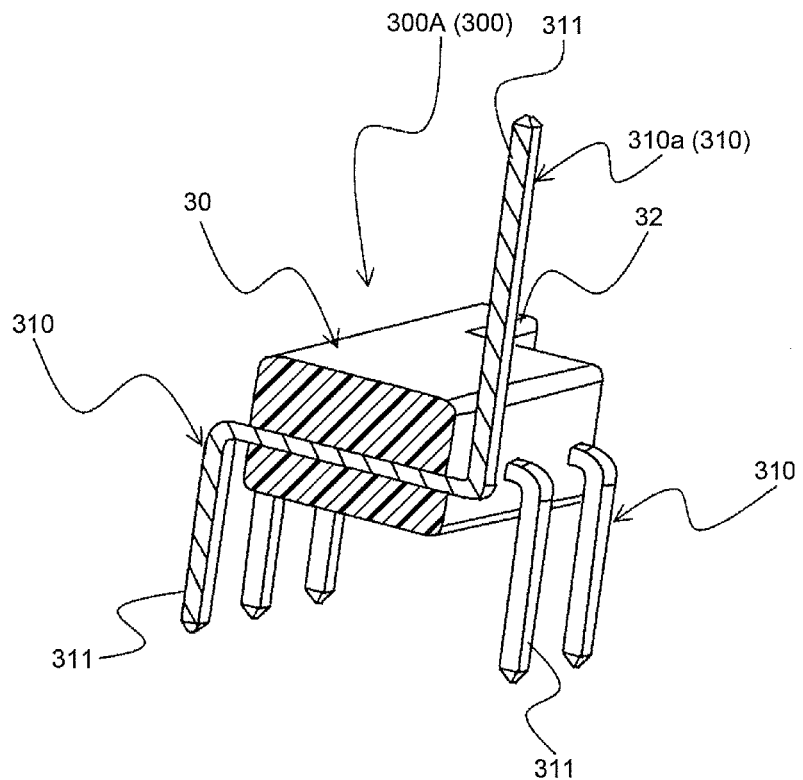
FIG. 15 is a cross-sectional view of the jumper module.
Figure 16A:
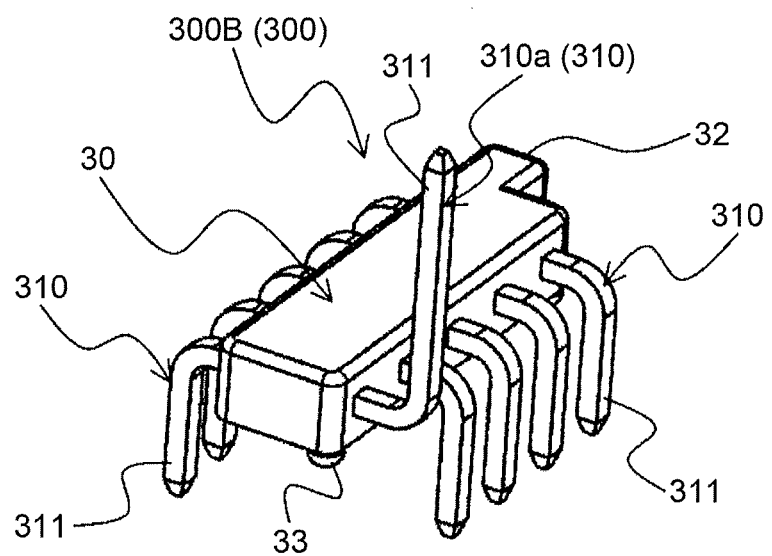
FIGS. 16A and 16B are views illustrating, by way of example, a plurality of jumper modules each depending on the respective wiring specifications.
Figure 16B:
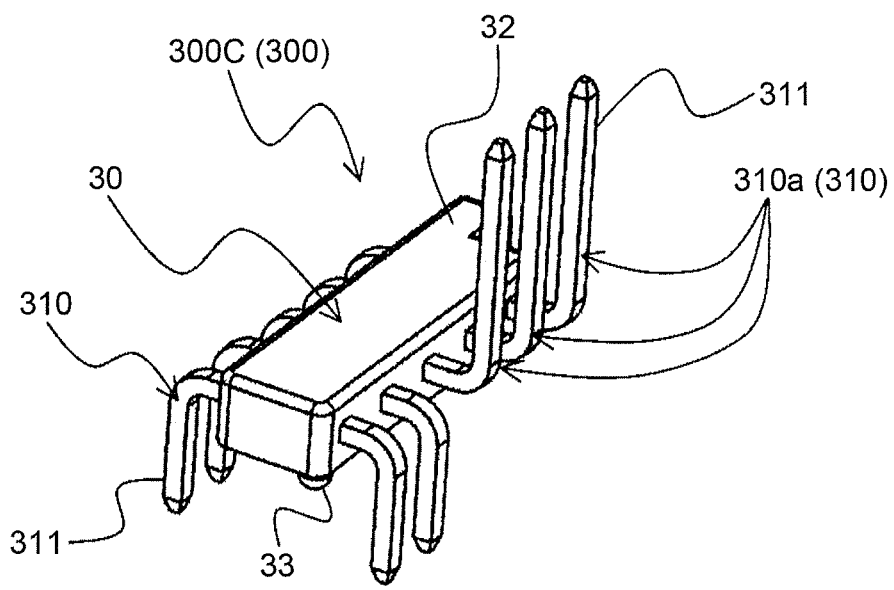

FIG. 12A is a perspective view of an electrical junction box 600 in which the circuit board assembly 500 according to the second embodiment of the present invention is incorporated, and FIG. 12B is an enlarged view illustrating the vicinity of a jumper module 300. FIG. 13A is a rear view of the jumper module 300, FIG. 13B is a side view of the jumper module 300, and FIG. 13C is a bottom view of the jumper module 300. FIG. 14 is a perspective view of the jumper module 300. FIG. 15 is a cross-sectional view of the jumper module 300. FIGS. 16A and 16B illustrate, by way of example, a plurality of jumper modules 300 depending on the respective wiring specifications.

Note that the same components as those of the first embodiment are denoted by the same reference symbols.

The electrical junction box 600 allows a box main body 610 to hold the circuit board 40 and another circuit board 400 which are opposed to each other.

The circuit board assembly 500 according to the second embodiment of the present invention has a jumper module mounting circuit board 4 and another circuit board 400 that is disposed to face the circuit board 40. Furthermore, the jumper module 300 has at least one electrical connection part 310 that has a contact part 311 on one end side to be connected to the connection pattern 51 and a contact part 311 on the other end side to be connected to the another circuit board 400.

First, a description will be made to the jumper module 300.

The jumper module 300 is configured such that the insulator main body 30 is provided with electrical connection parts 310 depending on the wiring specification.

Note that a description will be made to a typical jumper module (hereafter to be denoted by symbol 300A) which has five electrical connection parts 310.

As illustrated in FIGS. 13A to 15, the electrical connection part 310 is formed by bending a bar-shaped metal member into a gate-like shape or a crank-like shape, and both end portions serve as the contact parts 311. Each of the electrical connection parts 310 is molded integrally with the insulator main body 30. That is, the insulator main body 30 securely holds each of the electrical connection parts 310.

The jumper module 300A is configured such that among the five electrical connection parts 310, one electrical connection part 310 (hereafter to be denoted by reference symbol 310a) is bent into a crank-like shape, so that the contact part 311 on one end is connected to a connection pattern 51 of the circuit board 40 and the contact part 311 on the other end is connected to another connection pattern 451 of the another circuit board 400. That is, the electrical connection part 310a is connected to the two circuit boards 40 and 400.

Note that like the electrical connection parts 20 of the first embodiment, the remaining four gate-shaped electrical connection parts 310 are configured such that the contact parts 311 on both ends are connected to the connection patterns 51 of the circuit board 40.

On the other hand, as illustrated in FIGS. 16A and 16B, a plurality of jumper modules 300B and 300C other than the jumper module 300A can also be illustrated, by way of example, as the jumper module 300 which is selectively connected to the connection patterns 51 and 451 of respective connection pattern concentrated sections 50 and 450 on the two circuit boards 40 and 400 that are disposed opposed to each other.

The jumper module 300B is configured such that the insulator main body 30 securely holds one crank-shaped electrical connection part 310a on the most rear end side (refer to FIG. 16A).

The jumper module 300C is configured such that the insulator main body 30 securely holds three crank-shaped electrical connection parts 310a (refer to FIG. 16B).

Note that the jumper module 300 is not limited to the types illustrated in the second embodiment. That is, the jumper module 300 only has to include at least one electrical connection part 310 which is configured such that the contact part 311 on one end side is connected to a connection pattern 51 and the contact part 311 on the other end side is connected to another connection pattern 451 formed on the another circuit board 400.

Now, a description will be made to the another circuit board 400.

The another circuit board 400 has the another connection pattern concentrated section 450 that is formed by concentrating other connection patterns 451 depending on a plurality of wiring specifications at the mount position P of the jumper module 300.

Thus, when any one of the plurality of jumper modules 300A, 300B, and 300C is mounted onto the circuit board 40 and as well connected to the another circuit board 400, the contact parts 311 of the mounted jumper module 300A, 300B, or 300C are connected to the corresponding connection patterns 51 and 451 of the respective connection pattern concentrated sections 50 and 450.

That is, it is possible to construct the circuit board assembly 500 depending on the wiring specifications of the two circuit boards 40 and 400 by replacing the jumper module 300 that is connected to both the two circuit boards 40 and 400.

The circuit board assembly 500 according to the second embodiment of the present invention can accommodate a plurality of wiring specifications by replacing the jumper module 300 to be mounted onto the circuit board 40 as in the first embodiment. It is thus possible to reduce costs of parts by employing the circuit board 40 as a common part, and to use the jumper module 300 as an electrical connection part for connecting between the two circuit boards 40 and 400.

Furthermore, the circuit board assembly 500 according to the second embodiment of the present invention can accommodate a plurality of wiring specifications of the two circuit boards 40 and 400 by replacing the jumper module 300 that is connected to both the two circuit boards 40 and 400 that are disposed opposed to each other. It is thus possible to reduce costs of parts by employing the two circuit boards 40 and 400 as common parts.

Modified Example

Figure 17:
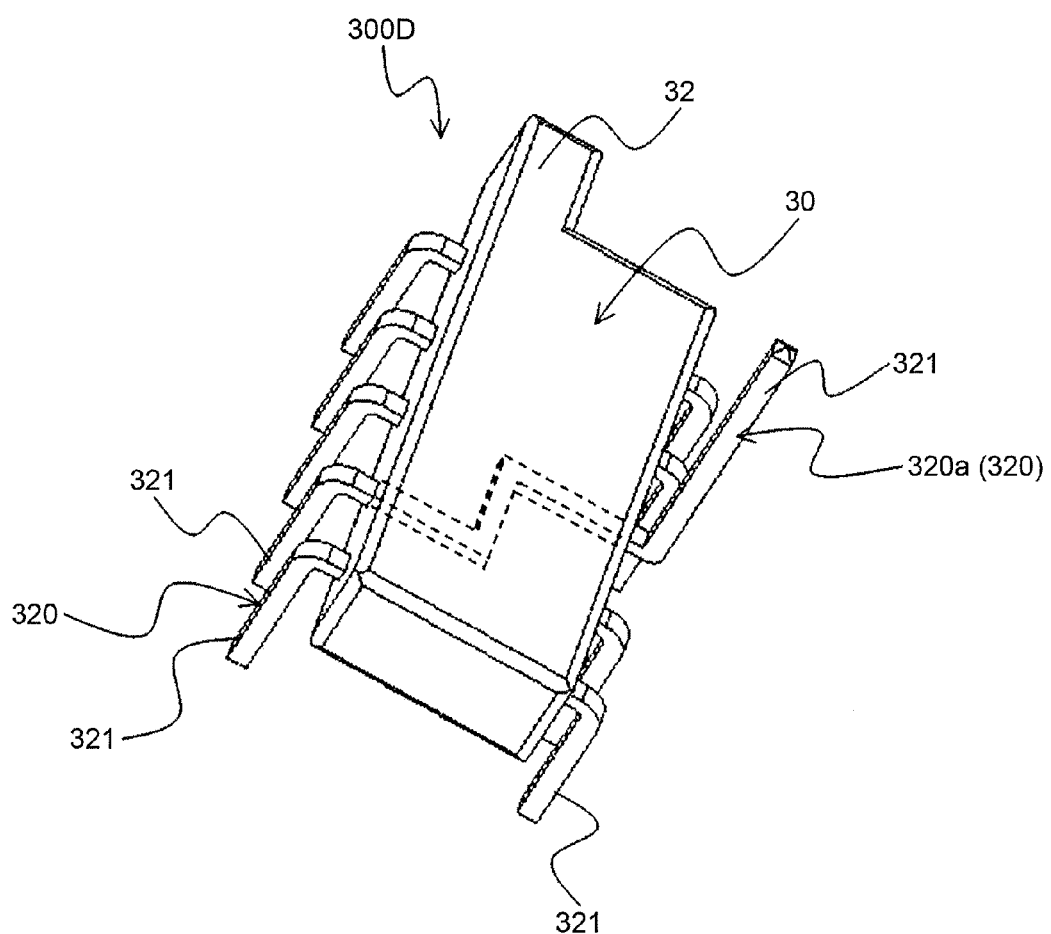
FIG. 17 is a perspective view of a jumper module according to a modified example.

Now, referring to FIG. 17, a description will be made to a modified example of the jumper module 300 of the circuit board assembly 500 according to the second embodiment of the present invention. FIG. 17 is a perspective view of a jumper module 300D according to the modified example.

The jumper module 300D according to the modified example is different from the jumper module 300 of the second embodiment in that among five electrical connection parts 320, an electrical connection part 320a that connects between both the two circuit boards 40 and 400 is bent into a crank-like shape that is different from that of the electrical connection part 310 of the second embodiment.

Note that the other components are the same as those of the second embodiment, and the same components as those of the second embodiment are denoted by the same reference symbols.

Like the jumper module 300 of the second embodiment, the jumper module 300D according to the modified example can connect between both the two circuit boards 40 and 400.

First Modified Example

Figure 18A:
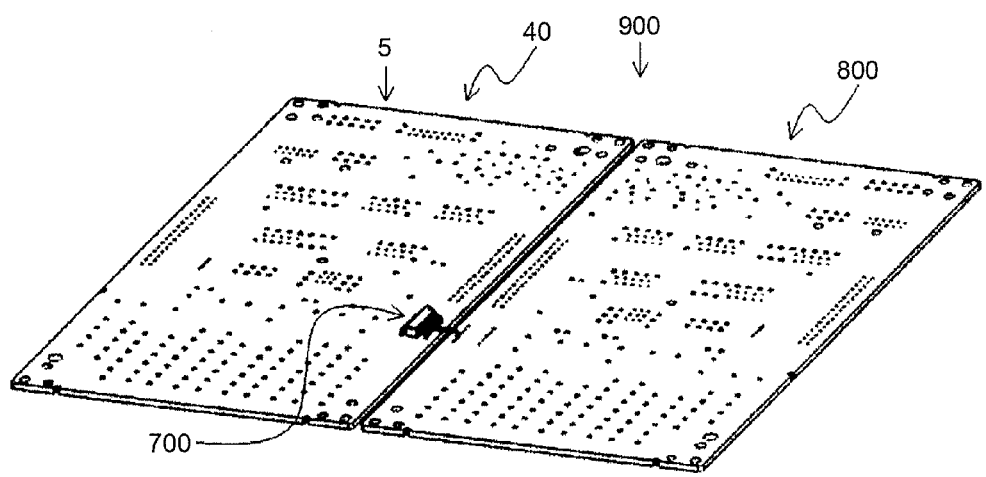
FIG. 18A is a perspective view of a circuit board assembly according to a first modified example.
Figure 18B:
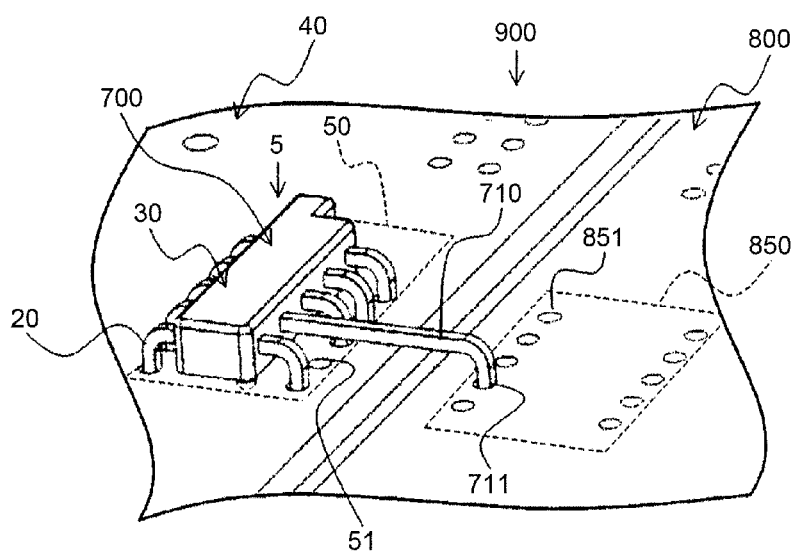
FIG. 18B is an enlarged view illustrating the vicinity of the jumper module of FIG. 18A.
Figure 19:
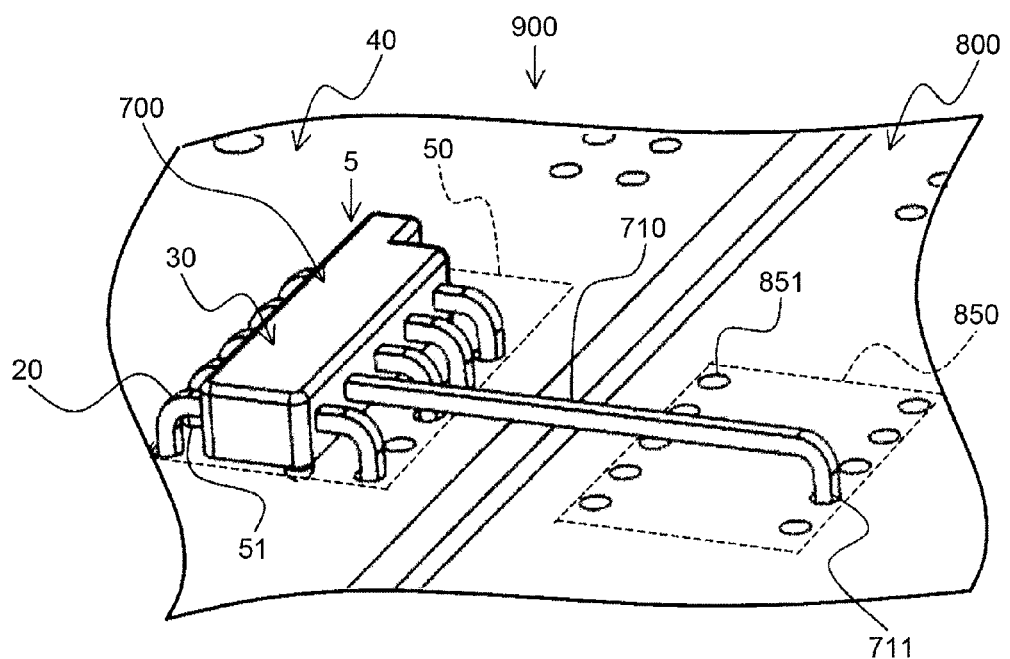
FIG. 19 is a view illustrating an example in which a contact part of the jumper module illustrated in FIGS. 18A and 18B is connected to a different connection pattern of another circuit board.

Now, referring to FIGS. 18A, 18B and 19, a description will be made to a first modified example of the circuit board assembly 500 according to the second embodiment of the present invention. FIG. 18A is a perspective view of a circuit board assembly 900 according to the first modified example, and FIG. 18B is an enlarged view illustrating the vicinity of a jumper module 700 of FIG. 18A. FIG. 19 is a view illustrating an example in which a contact part 711 of the jumper module 700 illustrated in FIGS. 18A and 18B is connected to a different connection pattern 851 of another circuit board 800.

The circuit board assembly 900 according to the first modified example is different from the circuit board assembly 500 of the second embodiment in that the two circuit boards 40 and 800 between which the jumper module 700 connects are placed side by side on the same plane while the circuit board assembly 500 is configured such that the two circuit boards 40 and 400 between which the jumper module 300 connects are disposed opposed to each other.

Note that the other components are the same as those of the second embodiment, and the same components as those of the second embodiment are denoted by the same reference symbols.

The circuit board assembly 900 has a jumper module mounting circuit board 5 and another circuit board 800 that is disposed side by side on the same plane as that of the circuit board 40.

Like the circuit board assembly 500 of the second embodiment, the circuit board assembly 900 is configured such that the another circuit board 800 has another connection pattern concentrated section 850 that is formed by concentrating other connection patterns depending on a plurality of wiring specifications, and the jumper module 700 has at least one electrical connection part 710 that has a contact part 711 on one end side to be connected to a connection pattern 51 and a contact part 711 on the other end side to be connected to the another circuit board 800.

Thus, as illustrated in FIGS. 18A, 18B and 19, the jumper module is configured such that the contact part 711 can be selectively connected both to a connection pattern 51 of the connection pattern concentrated section 50 and to another connection pattern 851 of the another connection pattern concentrated section 850.

The circuit board assembly 900 according to the first modified example can produce the same effects as those of the circuit board assembly 500 of the second embodiment.

Second Modified Example

Figure 20A:
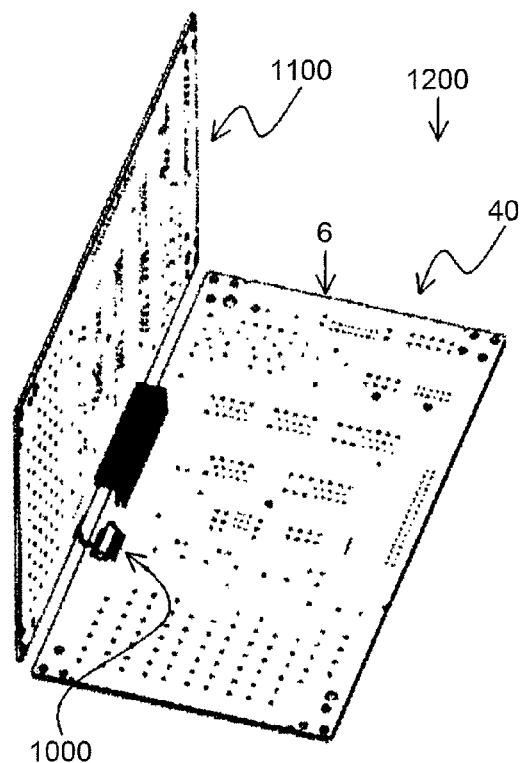
FIG. 20A is a perspective view of a circuit board assembly according to a second modified example.
Figure 20B:
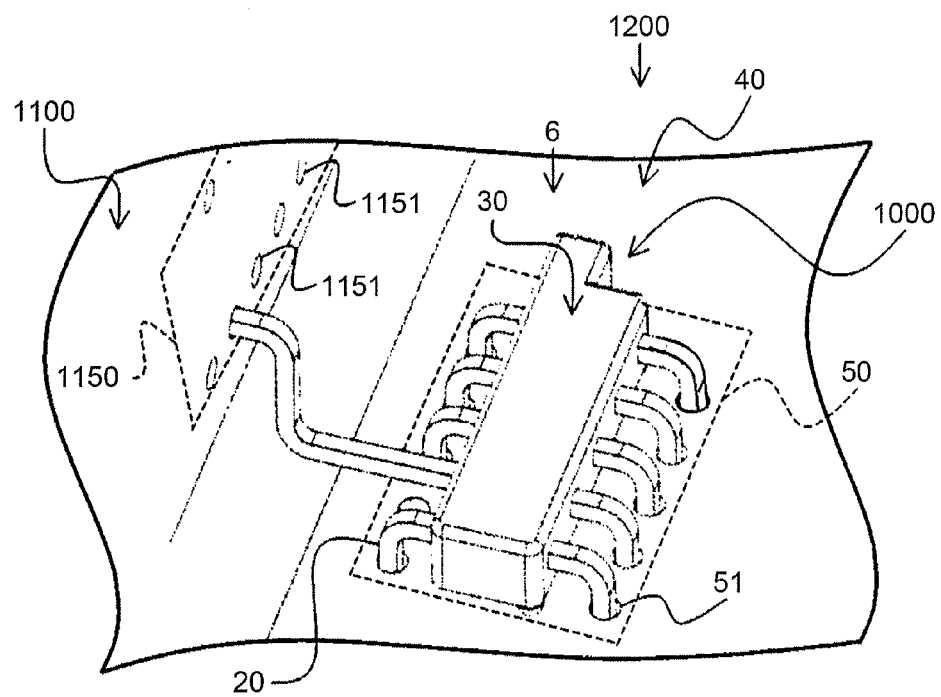
FIG. 20B is an enlarged view illustrating the vicinity of the jumper module of FIG. 20A.

Now, referring to FIGS. 20A and 20B, a description will be made to a second modified example of the circuit board assembly 500 according to the second embodiment of the present invention. FIG. 20A is a perspective view of a circuit board assembly 1200 according to the second modified example, and FIG. 20B is an enlarged view illustrating the vicinity of a jumper module 1000 of FIG. 20A.

The circuit board assembly 1200 according to the second modified example is different from the circuit board assembly 500 of the second embodiment in that two circuit boards 40 and 1100 between which the jumper module 1000 connects are disposed to be orthogonal to each other while the circuit board assembly 500 is configured such that the two circuit boards 40 and 400 between which the jumper module 300 connects are disposed opposed to each other.

Note that the other components are the same as those of the second embodiment, and the same components as those of the second embodiment are denoted by the same reference symbols.

The circuit board assembly 1200 has a jumper module mounting circuit board 6 and another circuit board 1100 which is disposed to be orthogonal to the circuit board 40.

Like the circuit board assembly 500 of the second embodiment, the circuit board assembly 1200 is configured such that the another circuit board 1100 has another connection pattern concentrated section 1150 that is formed by concentrating other connection patterns depending on a plurality of wiring specifications, and the jumper module 1000 has at least one electrical connection part 1010 that has a contact part 1011 on one end side to be connected to a connection pattern 51 and a contact part 1011 on the other end side to be connected to the another circuit board 1100.

Thus, the jumper module 1000 is configured such that the contact part 1011 can be selectively connected both to the connection pattern 51 of a connection pattern concentrated section 1150 and to another connection pattern 1151 of the another connection pattern concentrated section 1150.

The circuit board assembly 1200 according to the second modified example can produce the same effects as those of the circuit board assembly 500 of the second embodiment.

Third Modified Example

Figure 21A:
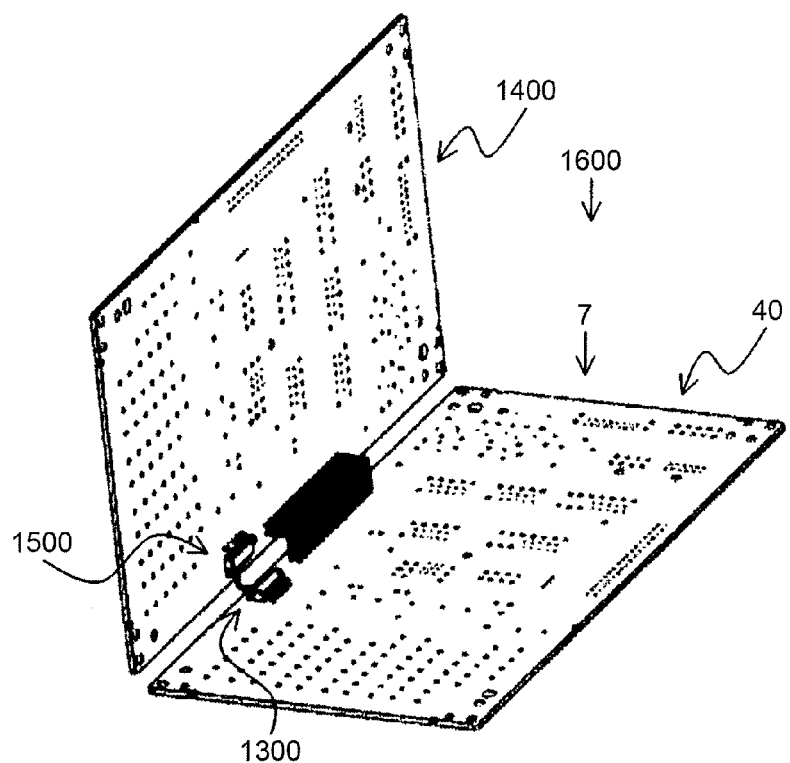
FIG. 21A is a perspective view of a circuit board assembly according to a third modified example.
Figure 21B:
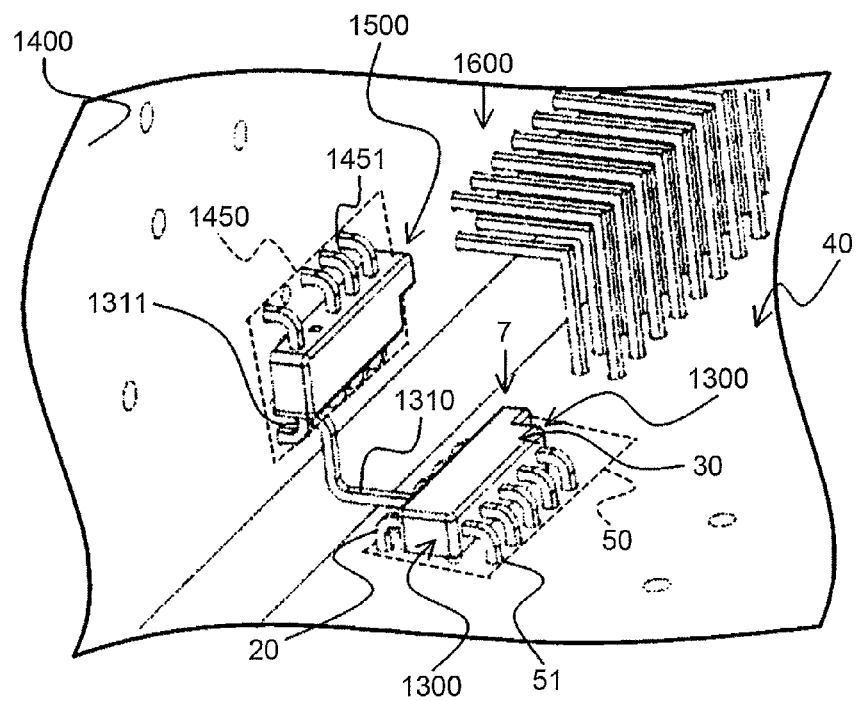
FIG. 21B is an enlarged view illustrating the vicinity of the jumper module of FIG. 21A.

Now, referring to FIGS. 21A and 21B, a description will be made to a third modified example of the circuit board assembly 500 according to the second embodiment of the present invention. FIG. 21A is a perspective view of a circuit board assembly 1600 according to the third modified example, and FIG. 20B is an enlarged view illustrating the vicinity of a jumper module 1300 of FIG. 20A.

The circuit board assembly 1600 according to the third modified example is different from the circuit board assembly 500 of the second embodiment in that two circuit boards 40 and 1400 between which the jumper module 1300 connects are disposed to be orthogonal to each other, and another jumper module 1500 connected to at least one of other connection patterns 1451 is mounted on the another circuit board 1400.

Note that the other components are the same as those of the second embodiment, and the same components as those of the second embodiment are denoted by the same reference symbols.

The circuit board assembly 1600 has a jumper module mounting circuit board 7 and the another circuit board 1400 on which mounted is the another jumper module 1500 connected to other connection patterns 1451 and which is disposed to be orthogonal to the circuit board 40.

Like the circuit board assembly 500 of the second embodiment, the circuit board assembly 1600 is configured such that the another circuit board 1400 has another connection pattern concentrated section 1450 that is formed by concentrating the other connection patterns 1451 depending on a plurality of wiring specifications, and the jumper module 1300 has at least one electrical connection part 1310 that has a contact part 1311 on one end side to be connected to a connection pattern 51 and a contact part 1311 on the other end side to be connected to the another circuit board 1400.

The another jumper module 1500 is configured to be connected to at least one of the other connection patterns 1451.

The circuit board assembly 1600 according to the third modified example can produce the same effects as those of the circuit board assembly 500 of the second embodiment, and employ the two circuit boards 40 and 1400 as common parts for a larger number of wiring specifications by using the another jumper module 1500.

Note that the electrical connection parts 310, 320, 710, 1011, and 1311 of the jumper modules 300, 700, 1000, and 1300 of the second embodiment formed in a crank shape have been illustrated by way of example. However, the invention is not limited thereto. Other shapes may also be acceptable so long as the electrical connection parts are configured to connect between the two circuit boards 40, 400, 800, 1100, and 1400.

Furthermore, the circuit board assemblies 500, 900, 1200, and 1600 according to the second embodiment have been illustrated by way of example in which the another connection pattern concentrated section 450, 850, 1150, or 1450 is formed on the another circuit board 400, 800, 1100, or 1400. However, the invention is not limited thereto. It is also acceptable to form the other connection patterns 451, 851, 1151, or 1451 that each have at least one end of the electrical connection part 310, 320, 710, 1010, or 1310 to be connected to the another circuit board 400, 800, 1100, or 1400.

On the other hand, the jumper module mounting circuit boards 1, 2, and 3 according to the first embodiment of the present invention may also employ a small printed circuit board as the jumper module. Note that the small printed circuit board as the jumper module is configured such that the electrical connection parts are formed of printed wirings and the insulator main body is formed of laminated sheets of an insulation resin.

Furthermore, the jumper module mounting circuit boards 1, 2, 3, 4, 5, 6, and 7 according to the first and second embodiments of the present invention may be configured such that each of the contact parts 21, 71, 91, 311, 321, 711, 1011, and 1311 of the electrical connection parts 20, 70, 90, 310, 320, 710, 1010, and 1310 is formed by a so-called press-fit pin. Such an electrical connection part can maintain, without using solder, the connection to the connection patterns 51, 451, 851, 1151, and 1451 by pressure resulting from elastic deformation of the press-fit pin press-fitted into the through hole of the connection patterns 51, 451, 851, 1151, and 1451.

Furthermore, the jumper module mounting circuit boards 1, 2, 3, 4, 5, 6, and 7 according to the first and second embodiments of the present invention may also be configured such that an electrically conductive cylindrical member or a so-called pin socket may be provided on the circuit boards 40, 400, 800, 1100, and 1400 to implement the connection patterns 51, 451, 851, 1151, and 1451, the cylindrical member allowing the contact parts 21, 71, 91, 311, 321, 711, 1011, and 1311 to be fitted therein. Such connection patterns 51, 451, 851, 1151, and 1451 can maintain the connection to the contact parts 21, 71, 91, 311, 321, 711, 1011, and 1311 without using solder.

Furthermore, the jumper module mounting circuit boards 1, 2, 3, 4, 5, 6, and 7 according to the first and second embodiments of the present invention illustrated above by way of example are configured such that one jumper module 10, 60, 80, 300, 700, 1000, or 1300 is mounted onto one circuit board 40. However, the invention is not limited thereto.

It is also acceptable to mount a plurality of jumper modules 10, 60, 80, 300, 700, 1000, and 1300 on one circuit board 40.

Furthermore, the jumper module mounting circuit boards 1, 2, 3, 4, 5, 6, and 7, and the circuit board assemblies 500, 900, 1200, and 1600 according to the first and second embodiments of the present invention illustrated by way of example are configured such that the jumper modules 10, 60, 80, 300, 700, 1000, 1300, and 1500 have the insulator main body 30 and the electrical connection parts 20, 70, 90, 310, 320, 710, 1010, and 1310 molded integrally. However, the invention is not limited thereto. The electrical connection parts 20, 70, 90, 310, 320, 710, 1010, and 1310 may also be constructed to be removably attached to the insulator main body 30.

Furthermore, the jumper module mounting circuit board 1 according to the first embodiment of the present invention illustrated by way of example can employ a plurality of jumper modules 101, 102, 103, 104, 105, and 106 depending on the respective wiring specifications. However, the present invention is not limited thereto. It is also acceptable to prepare only a jumper module 101 having five electrical connection parts 20 that are capable of making all the first connection pattern array 50*a* and the second connection pattern array 50*b* electrically conductive, and then cut away unnecessary contact parts 21, thus manufacturing the jumper module 10 depending on the wiring specification.

Furthermore, the jumper module mounting circuit boards 1, 2, 3, 4, 5, 6, and 7 and the circuit board assemblies 500, 900, 1200, and 1600 according to the first and second embodiments of the present invention illustrated by way of example are incorporated into the electrical junction boxes 200 and 600, but without being limited thereto, may also be incorporated into other devices.

The jumper module mounting circuit board according to one aspect of the present invention is capable of accommodating a plurality of wiring specifications by replacing the jumper module to be mounted onto the circuit board, thereby reducing costs of parts by employing the circuit board as a common part.

The jumper module mounting circuit board according to another aspect of the present invention is configured such that the jumper module employs the insulator main body having the same shape irrespective of the wiring specification, and the contact parts are aligned depending on the layout of the first connection pattern array and the second connection pattern array. It is thus possible to position the jumper module at a mount position in the same manner irrespective of the wiring specification, and as a result, the contact parts and the connection patterns to be connected to each other can be easily positioned.

The jumper module mounting circuit board according to still another aspect of the present invention enables it to check the mounting orientation of the jumper module with the mounting orientation mark projection serving as a mark, thereby preventing the jumper module from being mistakenly oriented and mounted onto the circuit board.

The circuit board assembly according to still another aspect of the present invention can accommodate a plurality of wiring specifications by replacing the jumper module to be mounted onto the circuit board. It is thus possible to reduce costs of parts by employing the circuit board as a common part as well as to employ the jumper module as an electrical connection part for connecting between the two circuit boards.

The circuit board assembly according to still another aspect of the present invention can accommodate the plurality of wiring specifications of the two circuit boards by replacing the jumper module connecting to both the two circuit boards.

It is thus possible to reduce costs of parts by employing the two circuit boards as common parts.

The circuit board assembly according to still another aspect of the present invention can produce the same effects as those of the aforementioned circuit board assembly, and employ the two circuit boards as common parts for a larger number of wiring specifications by using the another jumper module.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A jumper module mounting circuit board comprising:
   a circuit board; and
   a plurality of jumper modules, each jumper module having an insulator main body provided with conductive electrical connection parts for connecting between connection patterns so as to provide electrical continuity therebetween by connecting each of contact parts on both ends of the conductive electrical connection parts to the connection patterns which are formed to be spaced apart from each other on the circuit board, a jumper module of the plurality of jumper modules being mounted onto the circuit board so as to connect between the contact parts and the connection patterns that are formed to be spaced apart from each other, wherein
   the circuit board has a connection pattern concentrated section that is formed by concentrating the connection patterns depending on a plurality of different wiring specifications at a mount position of the jumper module, and
   the plurality of jumper modules are differently configured such that the contact parts selectively connect to the connection patterns of the connection pattern concentrated section respectively associated with the plurality of wiring specifications, wherein a particular one of the plurality of jumper modules is selected based on a selected wiring specification of the circuit board.

2. The jumper module mounting circuit board according to claim 1, wherein
   the connection pattern concentrated section includes
   a first connection pattern array which is formed by aligning at equal intervals the plurality of connection patterns connecting to the contact parts on one end side of the electrical connection parts, and
   a second connection pattern array which is formed by aligning the plurality of connection patterns connecting to the contact parts on the other end so as to be disposed side by side with the first connection pattern array, and
   the jumper modules are configured such that the insulator main body has the same shape irrespective of wiring specifications, and the contact parts on the one end side are aligned depending on a layout of the first connection pattern array, and the contact parts on the other end side are aligned depending on a layout of the second connection pattern array.

3. The jumper module mounting circuit board according to claim 2, wherein
   the insulator main body has a mounting orientation mark projection that serves as a mark for indicating a normal mounting orientation in which the jumper modules are to be mounted onto the circuit board.

4. A circuit board assembly comprising:
   the jumper module mounting circuit board according to claim 2; and
   a second circuit board different from the circuit board, wherein
   the jumper modules have at least one of the electrical connection parts which connects the contact part on one end side to the connection pattern and which connects the contact part on the other end side to a second connection pattern formed on the second circuit board.

5. The jumper module mounting circuit board according to claim 1, wherein
   the insulator main body has a mounting orientation mark projection that serves as a mark for indicating a normal mounting orientation in which the jumper modules are to be mounted onto the circuit board.

6. A circuit board assembly comprising:
   the jumper module mounting circuit board according to claim 3; and
   a second circuit board different from the circuit board, wherein
   the jumper modules have at least one of the electrical connection parts which connects the contact part on one end side to the connection pattern and which connects the contact part on the other end side to a second connection pattern formed on the second circuit board.

7. A circuit board assembly comprising:
   the jumper module mounting circuit board according to claim 1; and
   a second circuit board different from the circuit board, wherein
   the jumper modules have at least one of the electrical connection parts which connects the contact part on one end side to the connection pattern and which connects the contact part on the other end side to a second connection pattern formed on the second circuit board.

8. The circuit board assembly according to claim 7, wherein
   the second circuit board has a second connection pattern concentrated section that is formed by concentrating the second connection patterns depending on a plurality of wiring specifications, and
   the jumper modules are configured such that the contact parts selectively connect to both the connection patterns of the connection pattern concentrated section and to the second connection patterns of the second connection pattern concentrated section.

9. The circuit board assembly according to claim 8, wherein
   the second circuit board mounts a second jumper module from the plurality of jumper modules that connects to at least one of the second connection patterns.

* * * * *